(12) United States Patent
Davidovici et al.

(10) Patent No.: US 6,587,452 B1
(45) Date of Patent: Jul. 1, 2003

(54) HIGH PERFORMANCE SIGNAL STRUCTURE WITH MULTIPLE MODULATION FORMATS

(75) Inventors: Sorin Davidovici, Jackson Heights, NY (US); Emmanuel Kanterakis, North Brunswick, NJ (US); Izumi Iida, Shiojiri (JP); Norio Hama, Okaya (JP); Nobuhiko Kenmochi, Shiojiri (JP)

(73) Assignees: Golden Bridge Technology, Inc., West Long Branch, NJ (US); Seiko Epson Corporation, Suwa (JP)

( * ) Notice: Subject to any disclaimer, the term of this patent is extended or adjusted under 35 U.S.C. 154(b) by 0 days.

(21) Appl. No.: 09/224,722

(22) Filed: Jan. 4, 1999

(51) Int. Cl.$^7$ ................................................ H04Q 7/28
(52) U.S. Cl. .................... 370/342; 370/206; 370/479; 370/208; 370/441; 370/483; 370/536; 370/542; 375/297; 375/298; 375/300; 375/302; 375/140; 375/322; 375/345; 455/522
(58) Field of Search ................................ 370/204, 206, 370/342, 465, 479, 912, 208, 209, 441, 483, 536, 542; 375/297, 298, 300, 302, 308, 140, 150, 151, 152, 153, 322, 345; 455/522, 61; 711/202, 221

(56) References Cited

U.S. PATENT DOCUMENTS

| | | | | |
|---|---|---|---|---|
| 5,068,899 A | * | 11/1991 | Ellis et al. | 381/31 |
| 5,390,165 A | * | 2/1995 | Tuch | 370/17 |
| 5,507,018 A | * | 4/1996 | Seppala | 455/127 |
| 5,581,651 A | * | 12/1996 | Ishino et al. | 395/2.14 |
| 5,768,684 A | * | 6/1998 | Grubb et al. | 455/13.4 |
| 5,778,414 A | * | 7/1998 | Winter et al. | 711/5 |
| 5,805,585 A | * | 9/1998 | Javitt et al. | 370/342 |
| 5,949,790 A | * | 9/1999 | Pehkonen et al. | 370/465 |
| 6,097,965 A | * | 8/2000 | Honkasalo et al. | 455/550 |
| 6,144,860 A | * | 11/2000 | Komatsu | 455/522 |
| 6,154,450 A | * | 11/2000 | Wallentin et al. | 370/311 |
| 6,157,642 A | * | 12/2000 | Sturza et al. | 370/389 |
| 6,256,510 B1 | * | 7/2001 | Muraoka | 455/522 |

* cited by examiner

Primary Examiner—Hassan Kizou
Assistant Examiner—Joe Logsdon
(74) Attorney, Agent, or Firm—David Newman Chartered

(57) ABSTRACT

A mapping memory, for use with a transmitter, for mapping a first signal segment and a second signal segment of a packet so that each signal segment has the same average power level. Each signal segment is characterized by a different modulation format. The first signal segment might use BPSK, while the second signal segment might use QAM, having multiple amplitude levels.

22 Claims, 5 Drawing Sheets

HIGH PERFORMANCE SIGNAL STRUCTURE WITH MULTIPLE MODULATION FORMATS

BACKGROUND OF THE INVENTION

This invention relates to communications systems, and more particularly to setting automatic gain control during signal acquisition, while transitioning from an overhead segment to data-bearing segment.

DESCRIPTION OF THE RELEVANT ART

In select modes of operation of communication systems there exists the need to rapidly set the automatic gain control (AGC) setting while performing other overhead functions, such as during signal acquisition. In addition, the signal often changes its structure when transitioning from the overhead segment to the data-bearing segment.

As an example, consider a packet communication system that has an acquisition header section modulated using the binary-phase-shift-key (BPSK) formal and a data bearing section modulated using the quadrature-amplitude-modulation (QAM) format. In general, the AGC setting attained during the BPSK modulation signal segment has to change during the QAM signal segment due to the differences in signal structure between the two signal segments. A gain transient is introduced at the boundary of the two signal segments that impairs the system performance bit error rate (BER) during the duration of the transient.

SUMMARY OF THE INVENTION

A general object of the invention is to set an automatic gain control during signal acquisition.

Another object of the invention is to set an automatic gain control from a header, of a packet, using binary-phase-shift-key modulation and maintain the setting for data, in the packet, using quadrature-amplitude modulation.

According to the present invention, as embodied and broadly described herein, a packet transmitter for communicating data in a plurality of packets is provided. Each packet has at least a first signal segment and a second signal segment. Each signal segment is characterized by a different modulation format. The first signal segment, by way of example, might have binary-phase-shift-keying (BPSK) modulation and serve as a header for synchronization. The second signal segment might have quadrature amplitude modulation (QAM) and contains data.

The invention includes a mapping circuit, or other equivalent device, for mapping the first signal segment and the second signal segment between an address port, or equivalent signal input port, and an output port, so that some statistic of the second signal segment, such as the average power level, or probability of error, of the second signal segment, is the same statistic of the first signal segment, such as the average power level, or probability of error, of the first signal segment. The mapping circuit also includes an input port for inputting mapping characteristics of the first signal segment and mapping characteristics of the second signal segment. The mapping characteristics of each signal segment, be they for the first signal segment, the second signal segment or for a plurality of signal segments, are designed so that the average power level of the first signal segment, of the second signal segment or of a plurality of signal segments is the same.

The mapping circuit typically might be used with a transmitter having a plurality of data channels at an input, and the plurality of data channels are spread-spectrum processed and combined as a multilevel signal. The multilevel signal gives rise to variable output power levels when compared to a continuous wave signal having BPSK modulation.

Additional objects and advantages of the invention are set forth in part in the description which follows, and in part are obvious from the description, or may be learned by practice of the invention. The objects and advantages of the invention also may be realized and attained by means of the instrumentalities and combinations particularly pointed out in the appended claims.

BRIEF DESCRIPTION OF THE DRAWINGS

The accompanying drawings, which are incorporated in and constitute a part of the specification, illustrate preferred embodiments of the invention, and together with the description serve to explain the principles of the invention.

DETAILED DESCRIPTION OF THE PREFERRED EMBODIMENTS

Figure 1:
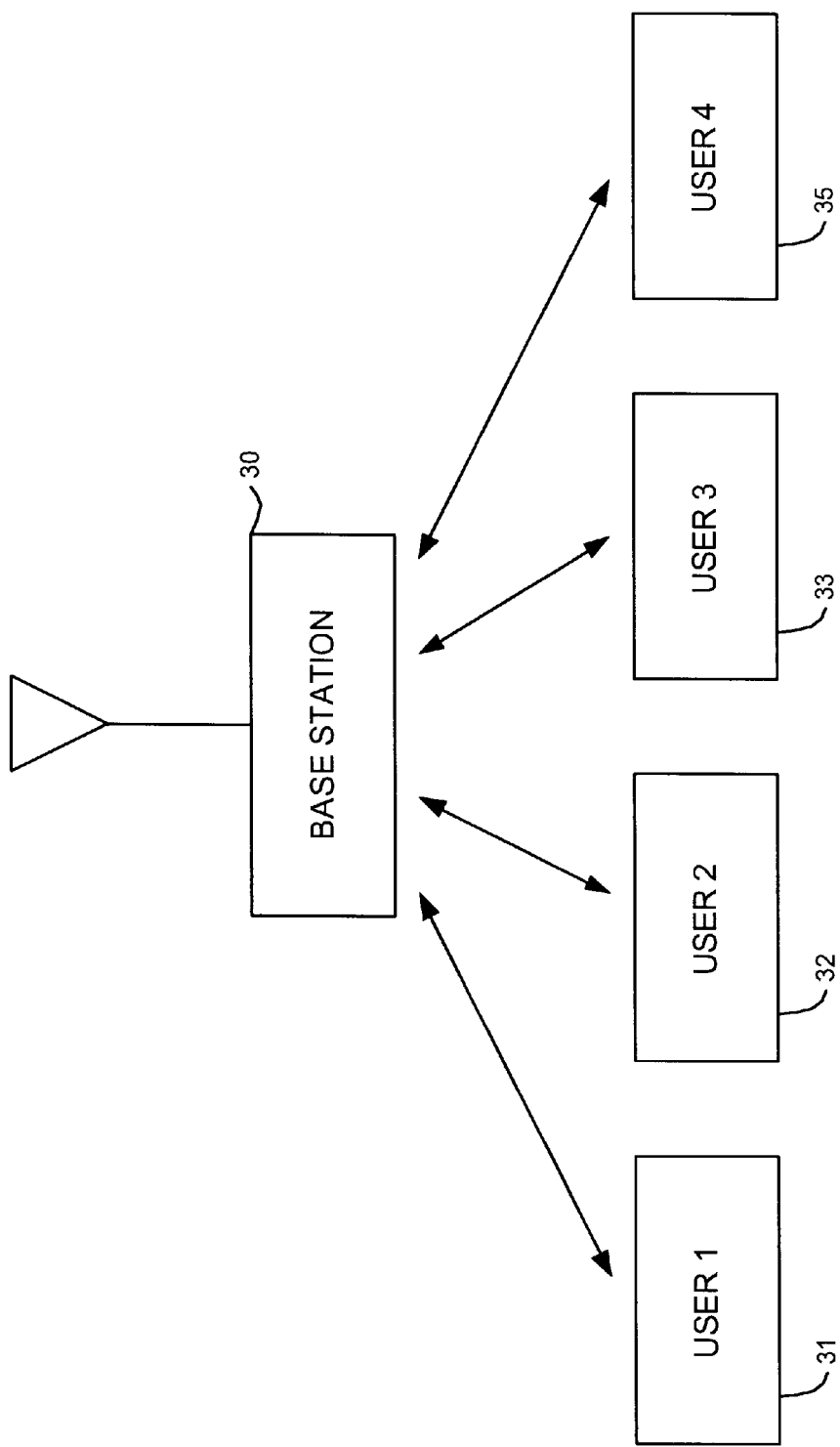
FIG. 1 illustrates a spread-spectrum packet system.

Reference now is made in detail to the present preferred embodiments of the invention, examples of which are illustrated in the accompanying drawings, wherein like reference numerals indicate like elements throughout the several views.

The present invention provides a new and novel spread-spectrum, packet-switched system, illustrated in FIG. 1, using a packet-spread-spectrum signal. The packet-spread-spectrum signal is a packet using spread-spectrum modulation. The packet includes a plurality of signal segments, and typically a first signal segment and a second signal segment. The first signal segment typically is a header, using a first modulation. The second signal segment typically is data, using a second modulation.

The packet-switched spread-spectrum system might be used as part of a radio-based ethernet system. The packet-switched system includes a base station 30 communicating with a plurality of users 31, 32, 33, 34. The packet-switched system alternatively could be used to communicate between two users, i.e., a peer-to-peer system, or several base stations could be accessed when needed. The base station and each user have a packet transmitter and a packet receiver. The present invention is illustrated, by way of example, with a packet transmitter transmitting the packet-spread-spectrum signal.

The packet-spread-spectrum signal, by way of example, includes a header as the first signal segment, followed in time by a multichannel-spread-spectrum signal as the second signal segment. The header is concatenated with the multichannel-spread-spectrum signal. The header is generated from spread-spectrum processing, by using techniques well known in the art, a header-symbol-sequence signal with a chip-sequence signal. The header-symbol-sequence signal is a predefined sequence of symbols. The header-symbol-sequence signal may be a constant value, i.e., just a series of 1-bits or symbols, or a series of 0-bits or symbols, or alternating 1-bits and 0-bits or alternating symbols, a pseudorandom symbol sequence, or other predefined sequence as desired. The chip-sequence signal is user-defined, and in a usual practice, is used with a header-symbol-sequence signal. The header, in a preferred embodiment, is a chip-sequence signal used for the purpose of synchronization, with the first modulation being BPSK.

Each spread-spectrum channel of the multichannel-spread-spectrum signal part of the packet-spread-spectrum signal is generated similarly, from techniques well known in the art as used for the header, by spread-spectrum processing a plurality of sub-data-sequence signals with a plurality of chip-sequence signals, respectively. The plurality of sub-data-sequence signals may be derived from data, or an analog signal converted to data, signaling information, or other source of data symbols or bits. The plurality of chip-sequence signals can be user-defined, and each chip-sequence signal preferably is orthogonal to other chip-sequence signals used for generating the plurally of spread-spectrum channels.

The plurality of spread-spectrum channels are combined linearly, thereby generating a multilevel signal. The combined signal is quadrature-amplitude modulated, as a second modulation. At the boundary between the first signal segment and the second signal segment is a gain transient due o the differences between the first modulation and the second modulation.

It is possible to avoid the gain transient at the segment boundary, and thus avoid the performance degradation, by carefully controlling the signal envelope. Using the example where a header uses BPSK modulation and the data uses QAM, and for an automatic gain control (AGC) that controls the gain using a constant received power criterion, the envelope of the BPSK modulated section has a lower peak value than the envelope of the QAM modulated section. Controlling the signal envelope ensures that the signal power in the two segments is of equal value and therefore an AGC transient does not occur. The specific mapping changes as a function of the specific modulation formats used.

Figure 2:
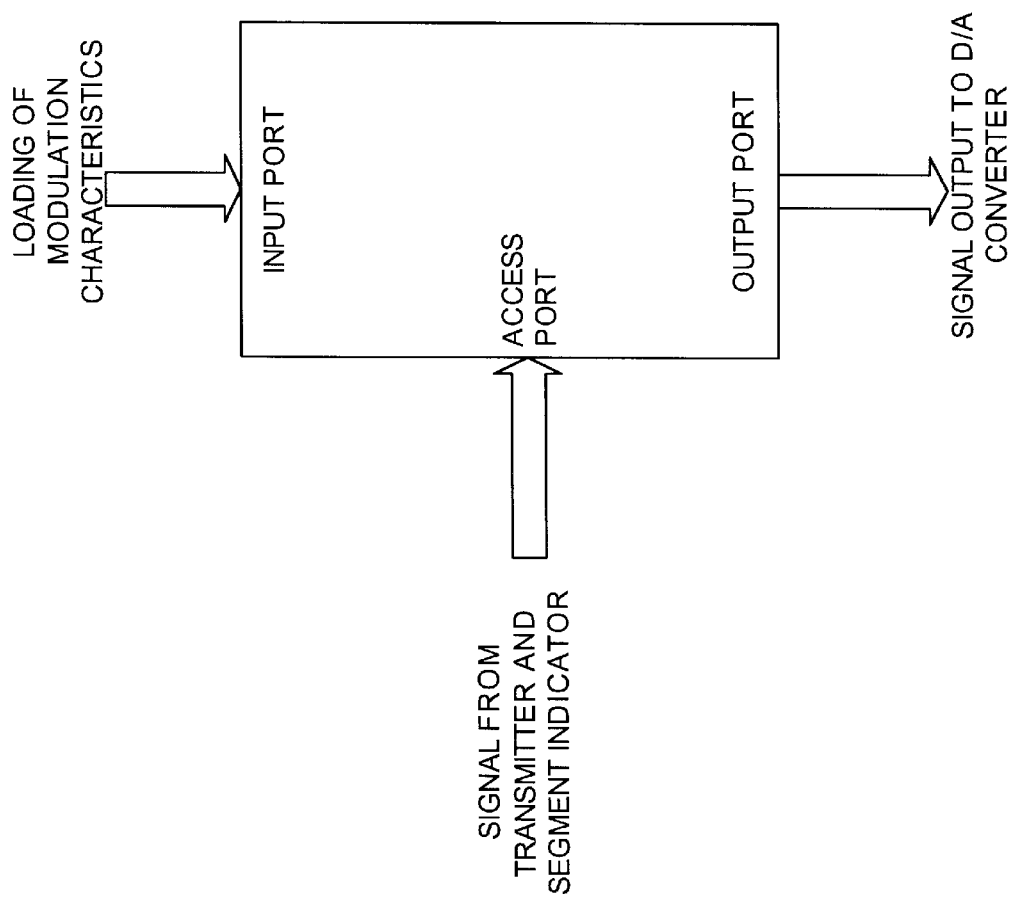
FIG. 2 illustrates a mapping memory according to the present invention.
Figure 3:
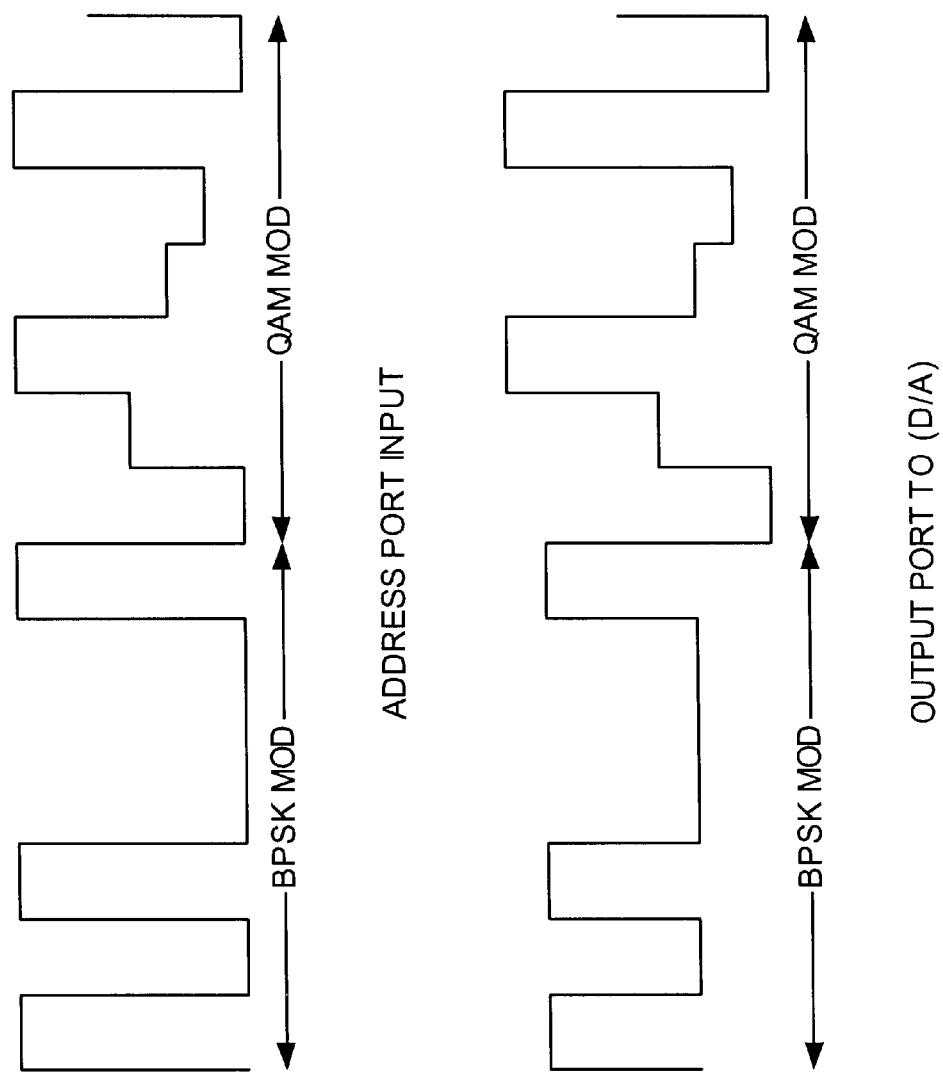
FIG. 3 illustrates an example of signal mapping.

The mapping is performed digitally and the mapping circuit, typically a memory, is placed at the transmitter section between the final digital signal generation stage and the output signal digital-to-analog (D/A) converter. FIG. 2 illustrates a potential implementation of this concept. The memory, which may be a random access memory (RAM), is loaded with two sets of mapping data. During the first signal segment, the amplitude of the BPSK-modulated input signal addresses a specific address range in he memory and the corresponding mapping of the BPSK signal amplitude is outputted to the digital-to-analog converter. During the second signal segment, the amplitude of the QAM-modulated input signal addresses a second address range in the memory and the corresponding mapping of the input amplitude is outputted to the D/A converter. FIG. 3 illustrates the effect of the mapping from the input to the output signal such that the AGC transient is avoided.

Packet-Switched System

The present invention broadly comprises a packet-switched-system for communicating data between a plurality of packet transmitters and a plurality of packet receivers, preferably using radio waves. The terms "packet transmitter" and "packet receiver", as used herein, denote the overall system components for transmitting and receiving, respectively, data.

The invention is taught, by way of example, using a multichannel spread-spectrum system.

Each packet transmitter includes transmitter-memory means, encoder means, demultiplexer means, transmitter-spread-spectrum means, first combiner means, header means, mapping means, and transmitter-subsystem means. For select modulation types, the packet transmitter may include second combiner means. The encoder means is coupled to the transmitter-memory means. The demultiplexer means, which is coupled to the encoder means, has a plurality of outputs. The transmitter-spread-spectrum means is coupled to the plurality of outputs of the demultiplexer means. The first combiner means is coupled between the transmitter-spread-spectrum means and the header means. The mapping means is coupled between the header means and the transmitter-subsystem means.

The transmitter-memory means is coupled to a data input, and stores data from the data input. The encoder means encodes the data from the transmitter-memory means as encoded data. The demultiplexer means demultiplexes the encoded data into a plurality of sub-data-sequence signals, with a respective sub-data-sequence signal at a respective output of the demultiplexer means.

The transmitter-spread-spectrum means spread-spectrum processes each of the sub-data-sequence signals with a respective chip-sequence signal. The output of the transmitter-spread-spectrum means is a plurality of spread-spectrum channels, with each spread-spectrum channel corresponding to one of the outputs of the demultiplexer means.

The first combiner means algebraically combines the plurality of spread-spectrum channels as a multichannel-spread-spectrum signal. The header means concatenates a header to the multichannel-spread-spectrum signal. The header is for chip-sequence synchronization. For QAM, the second combiner means is coupled to said header means. The second combiner means combines the first packet-spread-spectrum signal and the second packet-spread-spectrum signal as a quadrature amplitude modulated (QAM) signal.

The mapping means has an address port coupled to the header means or, for QAM, to the second combiner means, and an input port for inputting mapping characteristics of the first signal segment and mapping characteristics of the second signal segment. Typically the mapping characteristics of the first signal segment and the mapping characteristics of the second signal segment are inputted from a processor. In response to the first signal segment being present at the address port, the mapping means maps the first signal segment at a power level. The mapping of the first signal segment may be a pass through of the first signal segment through the mapping means. In response to the second signal segment being present at the address port, the mapping means maps the second signal segment at the same power level as the first signal segment. The mapping of the second signal segment may alter the second signal segment so that the second signal segment has the same average power as the first signal segment. This mapping thereby maintains a constant value of the power level for the second signal segment and the first signal segment. At the output of the mapping means is the packet-spread-spectrum signal having a constant value of power for the first signal segment and the second signal segment. The transmitter-subsystem means transmits, at a carrier frequency, the packet-spread-spectrum signal, using radio waves, over a communications channel.

Figure 4:
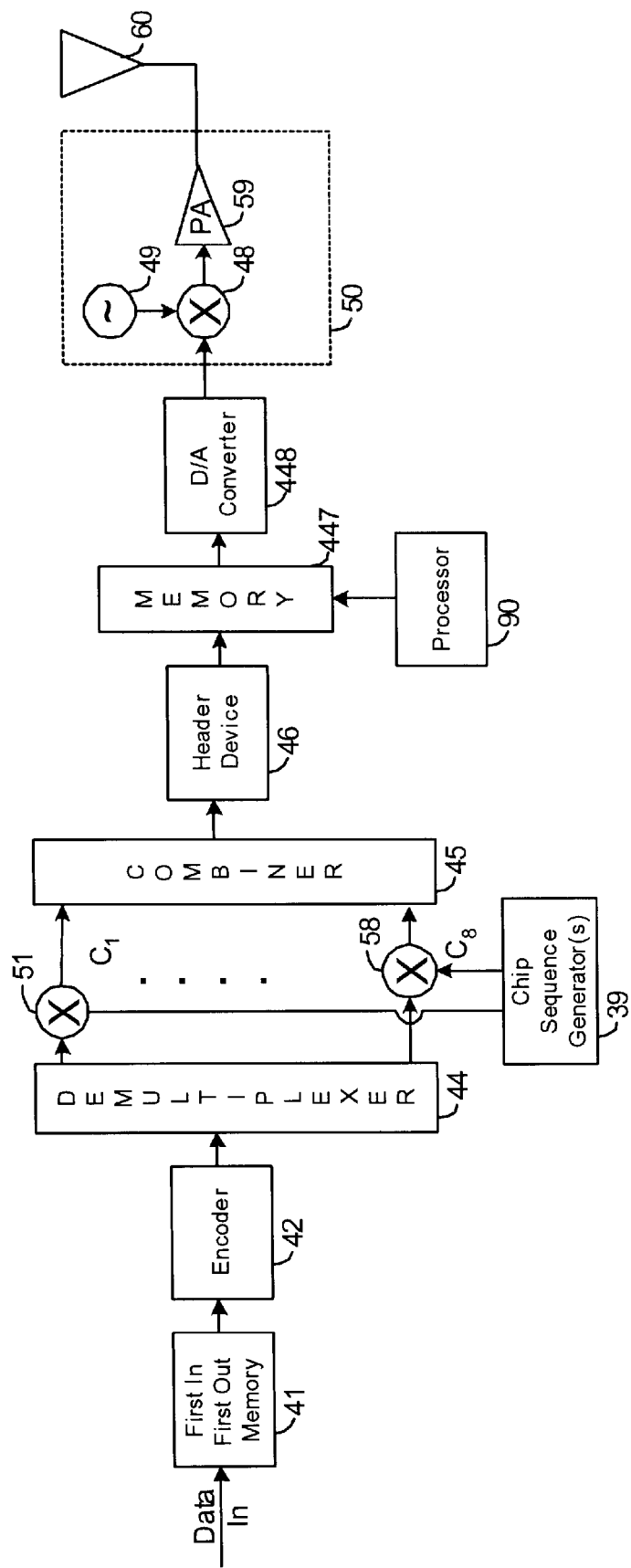
FIGS. 4 and 5 are block diagrams of a transmitter using a memory for signal mapping.

In the exemplary arrangement shown in FIG. 4, the transmitter-memory means is embodied as a transmitter-first-in-first-out (transmitter-FIFO) memory 41. The transmitter-FIFO memory 41 may employ random access memory (RAM) or other memory components as is well known in the art. The transmitter-FIFO memory 41 may be part of a digital signal processor (DSP) or, preferably, part of an application specific integrated circuit (ASIC).

For the case of an analog signal, an analog-to-digital converter would be inserted before the input to the transmitter-FIFO memory 41 for converting the analog signal to data. The analog-to-digital converter may be a one bit analog-to-digital converter, i.e., a hard limiter.

The encoder means is embodied as an encoder 42. The encoder 42 may be an encryptor or other privacy device. Encoders and privacy devices are well known in the art for encrypting or scrambling data. If security were not a primary concern, then privacy may be achieved employing modulo two addition of a bit-sequence signal, generated from a linear shift register. Encryption sequences, generated from a Data Encryption Standard (DES) algorithm, by way of example, may be used when privacy is of high concern.

The encoder 42 encodes the data from the transmitter-FIFO memory 41, as encoded data. The encoding process may include using any of an encryption device, a privacy device, or other device for uniquely distinguishing, as encoded data, a particular data channel. The term encoded data, as used herein, broadly means data that are encrypted or scrambled for privacy.

The demultiplexing means is embodied as a demultiplexer 44. The demultiplexer 44 has a plurality of outputs, with each output having a demultiplexed portion of the encoded signal.

The transmitter-spread-spectrum means is embodied as a chip-sequence means and a plurality of product devices 51–58. The chip-sequence means may be embodied as a chip-sequence generator 39 for generating a plurality of chip-sequence signals. Alternatively, the transmitter-spread-spectrum means may be embodied as a plurality of EXCLUSIVE-OR gates coupled between the plurality of outputs of the demultiplexer and a memory device for storing the plurality of chip-sequence signals. In this embodiment, the memory device outputs a respective chip-sequence signal to the respective sub-data-sequence signal. A third alternative may include having the transmitter-spread-spectrum means embodied as a memory device, with appropriate detection circuit so that in response to a particular data symbol or data bit at the output of a particular output the demultiplexer, a chip-sequence signal is substituted for that data symbol or data bit. The transmitter-spread-spectrum means may also be embodied as any other technology known in the art capable of outputting a plurality of chip-sequence signals.

The first combining means is embodied as a combiner 45, the header means is embodied as a header device 46 for concatenating a header with data, and she mapping mean is embodied as a memory 447, denoted herein as a "mapping memory". The mapping memory 447 may be a random access memory (RAM), a read only memory (ROM), an erasable programmable read-only memory EPROM, or other memory device. The mapping means alternatively may be a mapping circuit which performs the mapping functions as described herein. The mapping means typically is connected to a Processor 90 and through a digital-to-analog converter 448 to the transmitter subsystem. The digital-to-analog converter 448 converts the output signal from the mapping memory 447 to analog form.

The transmitter-subsystem means is embodied as a transmitter subsystem 50. The transmitter subsystem may include an oscillator 49 and multiplier device 48 for shifting a signal to a carrier frequency, and a power amplifier 59 and/or other circuitry as is well known in the art for transmitting a signal over a communications channel. The signal is transmitted using an antenna 60.

As shown in FIG. 4, the encoder 42 is coupled between the transmitter-FIFO memory 41 and the demultiplexer 44. The chip-sequence generator 39 is coupled to the plurality of product devices 51–58. The combiner 45 is coupled between the plurality of product devices 51–58 and the header device 46, and the header device 46 is coupled to the transmitter subsystem 50 through the memory 447 and D/A converter 448. The processor 90 is coupled to the memory 447.

The transmitter-FIFO memory 41 receives data from a data input, and stores the data.

The encoder 42 encodes the data from the transmitter-FIFO 41 as encoded data. The encoder 42 encodes the data using privacy type of encoding, i.e., scrambling the data or encrypting the data. Thus, the encoded data are scrambled data or encrypted data. The encoder 42 is necessary for distinguishing data from different users. By having the proper key for decoding the encoded data, data from a particular user are distinguished from data from other users. Thus, the encoding of the data is what defines a user's channel, unlike other multichannel spread-spectrum systems, where a user's channel is defined by a particular chip-sequence signal. By encoding the data with encoder 42, a common set of chip-sequence signals can be used by all users, reducing cost of having matched filters or correlators. The reduced cost is achieved since, at a receiver, one set of matched filters or correlator is required for the despreading the multichannel-spread-spectrum signal from all users, and different sets of matched-filters or correlators are not required for each user.

The demultiplexer 44 demultiplexes the encoded data into a plurality of sub-data-sequence signals, with a respective sub-data-sequence signal at a respective output of the demultiplexer 44. The demultiplexer 44 may be embodied as a serial-to-parallel converter.

The chip-sequence generator 39 generates a plurality of chip-sequence signals. Each of the chip-sequence signals of the plurality of chip-sequence signals has low correlation with the other chip-sequence signals in the plurality of chip-sequence signals, and is preferably orthogonal to the other chip-sequence signals in the plurality of chip-sequence signals.

The plurality of product devices 51–53, for example, may be embodied as a plurality of EXCLUSIVE-OR gates coupled between the plurality of outputs of the demultiplexer 44 and the chip-sequence means. Each EXCLUSIVE-OR gate multiplies a respective sub-data-sequence signal from the demultiplexer, by a respective chip-sequence signal from the chip-sequence generator 39.

The plurality of product devices 51–58 multiplies each of the sub-data-sequence signals by a respective chip-sequence signal. At the output of the plurality of product devices 51–58 is a plurality of spread-spectrum channels, respectively. A particular spread-spectrum channel is identified by the chip-sequence signal that was used to spread-spectrum process the particular sub-data sequence signal.

The combiner 45 algebraically combines the plurality of spread-spectrum channels, and outputs the combined signal as a multichannel-spread-spectrum signal. Preferably, the combiner 45 combines the plurality of spread-spectrum channels linearly, although some nonlinear process may be involved without significant degradation in system performance.

The header device 46 concatenates a header to the multichannel-spread-spectrum signal. At the output of the header device 46 is the packet-spread-spectrum signal. The header is for chip-sequence synchronization at the receiver.

The mapping means is embodied as a mapping memory 447. The mapping memory 447 has an address port coupled to the header device 46, and an input port, coupled to a processor 90, for inputting mapping characteristics of the first signal segment and mapping characteristics of the second segment. When the first signal segment is present at the address port, the mapping memory 447 maps the first signal segment at a power level the mapping of the first signal segment may be a pass through the mapping memory 447 of the first signal segment, without alteration to the first signal segment. When the second signal segment is present at the address port, the mapping memory 447 maps the second signal segment at the power level, thereby maintaining a constant value of the power level for the second signal segment and the first signal segment. The mapping of the second signal segment typically alters the second signal segment so that the second signal segment has the same average power as the first signal segment. The packet-spread-spectrum signal outputted from the mapping memory 447 is thus altered, in terms of power, from the packet-spread-spectrum signal inputted to the mapping memory 447. The mapping memory 447 may be a random access memory (RAM), read only memory (ROM), electronically programmable read only memory (EPROM), or other memory device as are well known in the art.

The digital-to-analog converter 448 converts the output from the mapping memory 447 to analog form.

The transmitter subsystem 50 transmits, at a carrier frequency, the packet-spread-spectrum signal from the digital-to-analog converter 448, having the constant value of power level for each signal segment, using radio waves over a communications channel. The transmitter subsystem 50 of the packet transmitter includes appropriate filters, power amplifiers and matching circuits coupled to an antenna 60. The transmitter subsystem 50 also may include a hard limiter, for hard limiting the packet-spread-spectrum signal before transmitting. The packet-spread-spectrum signal, as used above, may be in both digital form and analog form, as is converted from digital-to-analog form by digital-to-analog converter 448.

The present invention also comprises a method. The method includes the steps of storing data in a memory and encoding the data from the memory as encoded data. The data are demultiplexed using a demultiplexer, into sub-data sequence signals. The method includes generating a plurality of chip-sequence signals, and multiplying each of the sub-data-sequence signals by a respective chip-sequence signal, thereby generating a plurality of spread-spectrum channels.

The steps include algebraically combining the plurality of spread-spectrum channels as a multichannel-spread-spectrum signal, concatenating a header to the multichannel-spread-spectrum signal to generate a packet-spread-spectrum signal, mapping the first signal segment at a power level, mapping the second signal segment at the power level, thereby maintaining a constant value of the power level for the second signal segment and the first signal segment, and transmitting on a carrier frequency the packet-spread-spectrum signal having a constant power level for each signal segment over a communications channel using radio waves.

The packet-switched system is a wideband code division multiple access (W-CDMA) system, capable of transmitting, in a particular application, 9.6 megabits per second of data. For example, the following discussion assumes operation in the frequency band 2.4–2.483 GHz, although operation in other bands is possible. Preferred bandwidths are 26 MHz, available in Japan, and 70 MHz, for operation in USA, but again other bandwidths are possible.

In order to achieve a high processing gain at these bandwidths the data are demultiplexed. In FIG. 4, 19.2 megachips per second and a demultiplex factor of eight is employed for 26 MHz bandwidth operation.

The circuit operation of FIG. 4 is as follows:

1. The data are entered mechanically or electrically into a transmitter-FIFO memory 41 and read our at a 9.6 megabits per second rate.
2. The data are encoded by encoder 42 and, in the example shown here, a linear pseudo-noise (PN) generator generates a PN-bit-sequence signal. Such techniques for generating a PN bit sequence are well known in the art. A 127 length section of the $2^{16}-1 \cong 64,000$ length pseudo-noise sequence is used. Each user has a different PN-bit sequence. There are 64,000 different, 127 length PN-bit sequences possible in the system illustrated. The encoded data are demultiplexed into eight, 9.6/8=1.2 megabits per second sub-data-sequence signals.
3. Each bit is spread using a 16 chip/bit code. The chip-sequence signals $C_1$–$C_8$ are each orthogonal co one another, i.e., $C_i \cdot C_j = 0$, $i \neq j$.

Obtaining orthogonal chip-sequence signals is well known.

In a preferred embodiment, the standard procedure of caking a chip-sequence signal of length 15 is used and called g(i); the chip-sequence signal is shifted by n=1, 2, . . . , 15 to yield the code words g(i–n) n=1, . . . , 15. Each codeword is of length 15. Each chip-sequence signal is then increased by one chip by adding a zero chip as the last chip. Thus {{g(i–n)}, 0} contains 16 chips and chip-sequence signals for different n are orthogonal.
4. The sub-data-sequence signals, i.e., the multichannel-spread-spectrum signal, are concatenated with a header by a header device 46. In this example the header is a chip-sequence signal, 3,360 chips long.
5. Each user has the same header and the same set of spreading chip-sequence signals.
6. The number of chips/bit can be any number e.g., 4, 8, 16, 32. The key is that different chip-sequence signals, $C_i \cdot C_j$, are orthogonal. This enhances processing gain (PG) for increased interference immunity.

In other systems, only one user can transmit at a time and, if two users transmit simultaneously, a collision will occur and packet signals from both users will not be received correctly. In the packet-switched system of the present invention, two packet-spread-spectrum signals can be received simultaneously; a third may cause errors.

Clearly, two or three or more simultaneous transmissions depend only on the processing gain which is a design parameter and not fundamental to the present invention.
7. The spread data is upconverted and amplified by transmitter subsystem 50 and transmitted. Typical link analyses and packet switching specifications are included as Tables 1–4.

TABLE 1

Link Budget (Frequency = 2.4 Ghz; Bandwidth 70 MHz)

| Parameter | Units | Forward Link | Reverse Link |
|---|---|---|---|
| a. Transmit Power | dBm | 20 | 20 |
| b. Transmit Antenna Gain | dB | 0 | 0 |
| c. Receive Antenna Gain | dB | 0 | 0 |
| d. EIRP | dBm | 20 | 20 |
| e. Range | km | 0.4 | 0.4 |
| f. Range Loss | dB | −88 | −88 |
| g. Receive Signal Power | dBm | −68 | −68 |
| h. Noise Figure | dB | 6 | 6 |
| i. Noise Power Density | dBm/Hz | −174 | −174 |
| j. Noise Power in 70 MHz | dBm | −90 | −90 |
| k. Processing Gain | dB | 12 | 12 |
| l. Received $E_b/N_o$ | dB | 34 | 34 |
| m. Required $E_b/N_o$ | dB | 13 | 13 |
| n. Margin for shadowing | dB | 21 | 21 |

TABLE 2

10 Mb/s Packet Switching Specifications

| Equipment | Base | Terminal |
|---|---|---|
| Operating Band | 2400–2480 MHz | 2400–2480 MHz |
| Bandwidth | 70 MHz | 70 MHz |
| RF Bandwidth | 70 MHz | 70 MHz |
| Duplex Method | packet switched | packet switched |
| Multiple Access Technique | GBT-CDMA | GBT-CDMA |
| Number of Transmitter Chip-Sequences | $2^{31} - 1$ | $2^{31} - 1$ |
| TX data Rate: Traffic Signaling/APC | 9.6 Mb/s | 9.6 Mb/s |
| Control Frame Length | variable | variable |
| Data Modulation | BPSK | BPSK |
| Spreading Technique Sequence Length | Direct Sequence | Direct Sequence |
| Header | 48 chips | 48 chips |
| Data | 16 chips | 16 chips |
| Chip Rate | 38.4 Mchips/s | 38.4 Mchips/s |
| Processing Gain | 12 dB | 12 dB |
| Transmitter power (max) | 100 mW | 100 mW |
| Device Range (free space) | 0.4 km | 0.4 km |
| Number of Antenna Sectors | omni | omni |
| Capacity | | 2 simultaneous users |

TABLE 3

Link Budget (Frequency = 2.4 Ghz; Bandwidth = 26 MHz)

| Parameter | Units | Forward Link | Reverse Link |
|---|---|---|---|
| a. Transmit Power | dBm | 20 | 20 |
| b. Transmit Antenna Gain | dB | 0 | 0 |
| c. Receive Antenna Gain | dB | 0 | 0 |
| d. EIRP | dBm | 20 | 20 |
| e. Range | km | 0.8 | 0.8 |
| f. Range Loss | dB | −100 | −100 |
| g. Receive Signal Power | dBm | −80 | −80 |
| h. Noise Figure | dB | 6 | 6 |
| i. Noise Power Density | dBm/Hz | −174 | −174 |
| j. Noise Power in 26 MHz | dBm | −94 | −94 |
| k. Processing Gain | dB | 12 | 12 |
| l. Received $E_b/N_o$ | dB | 26 | 26 |
| m. Required $E_b/N_o$ | dB | 13 | 13 |
| n. Margin for shadowing | dB | 13 | 13 |

TABLE 4

10 Mb/s Packet Switching Specification

| Equipment | Base | Terminal |
|---|---|---|
| Operating Band | 2400–2480 MHz | 2400–2480 MHz |
| RF Bandwidth | 26 MHz | 26 MHz |
| Duplex Method | Time Division Duplex | Time Division Duplex |
| Multiple Access Technique | GBT-CDMA | GBT-CDMA |
| Number of Transmitter Chip-Sequences | | $2^{31} - 1$ |
| TX Data Rate: Traffic Signaling/APC | 384, 144, 128, 64, 32 Kb/s | 384, 144, 128, 64, 32 Kb/s |
| Forward Error Coding | Rate-½ Constraint Length-7 Convolutional Code | Rate-½ Constraint Length-7 Convolutional Code |
| Interleaver | 5 ms | 5 ms |
| Control Frame Length | 500 μsec | 500 μsec |
| Data Modulation | BPSK | BPSK |
| Spreading Technique | Direct Sequence | Direct Sequence |
| Sequence Length | 6,930,000 chips | 6,930,000 chips |
| Chip Rate | 38.4 Mchips/s | 38.4 Mchips/s |
| Processing Gain | 12 dB | 12 dB |
| Transmitter power (max) | 100 mW | 100 mW |
| Service Range (free space) | 0.8 km | 0.8 km |
| Number of Antenna | omni | omni |
| Capacity | | 2 simultaneous users |

QAM Packet-Switched System

The present invention also provides a new and novel spread-spectrum, packet-switched system, using a quadrature-amplitude-modulated (QAM) spread-spectrum signal. The QAM-spread-spectrum signal, in a preferred embodiment, includes a first header, followed in time by a first multichannel-spread-spectrum signal, and a second header, followed in time by a second multichannel-spread-spectrum signal. The first and second headers are concatenated with the first and second multichannel-spread-spectrum signals, respectively. The first and second headers are generated from spread-spectrum processing, by using techniques well known in the art, a header-symbol-sequence signal with a chip-sequence signal. The header-symbol-sequence signal is a predefined sequence of symbols. The header-symbol-sequence signal may be a constant value, i.e.; just a series of 1-bits or symbols, or a series of 0-bits or symbols, or alternating 1-bits and 0-bits or alternating symbols, a pseudorandom symbol sequence, or other predefined sequence as desired. The chip-sequence signal is user-defined, and in a usual practice, is used with a header-symbol-sequence signal. The header, in a preferred embodiment, is a chip-sequence signal used for the purpose of synchronization.

Each spread-spectrum channel of the first and second multichannel-spread-spectrum signals is generated similarly, from techniques well known in the art as used for the header, by spread-spectrum processing a plurality of sub-data-sequence signals with a plurality of chip-sequence signals, respectively. The plurality of sub-data-sequence signals may be derived from data, or an analog signal converted to data, signaling information, or other source of data symbols or bits. The plurality of chip-sequence signals can be user-defined, and each chip-sequence signal preferably is orthogonal to other chip-sequence signals used for generating the plurality of spread-spectrum channels.

In the QAM packet-switched system, each packet transmitter includes transmitter-memory means, encoder means, demultiplexer means, transmitter-spread-spectrum means, first combining means, second combining means, header means, mapping means, and transmitter-subsystem means. The encoder means is coupled to the transmitter-memory means. The demultiplexer means, which is coupled to the encoder means, has a plurality of outputs. The transmitter-spread-spectrum means is coupled to the plurality of outputs of the demultiplexer means. The first combining means is coupled between the transmitter-spread-spectrum means and the header means. The second combining means is coupled to the header means, and the mapping means is coupled between the second combining means and the transmitter-subsystem means.

The transmitter-memory means is coupled to a data input, and stores data from the data input. The encoder means encodes the data from the transmitter-memory means as encoded data. The demultiplexer means demultiplexes the encoded data into a first plurality of sub-data-sequence signals and a second plurality of sub-data-sequence signals, with a respective sub-data-sequence signal at a respective output of the demultiplexer means.

The transmitter-spread-spectrum means spread-spectrum processes each of the first plurality of sub-data-sequence signals, and each of the second plurality of sub-data-sequence signals, with a respective chip-sequence signal. The output of the transmitter-spread-spectrum means is a first plurality of spread-spectrum channels and a second plurality of spread-spectrum channels, with each spread-spectrum channel corresponding to one of the outputs of the demultiplexer means. First combining means algebraically combines the first plurality of spread-spectrum channels as a first multichannel-spread-spectrum signal, and the second plurality of spread-spectrum channels as a second multichannel spread-spectrum signal. The header means concatenates a first header to the first multichannel-spread-spectrum signal, and a second header to the second multichannel spread-spectrum signal. The first header and the second header are for chip-sequence synchronization. At the output of the header means is a first packet-spread-spectrum signal and a second packet-spread-spectrum signal. Second combining means, coupled to said header means, combines the first packet-spread-spectrum signal and the second packet-spread-spectrum signal as a quadrature amplitude modulated (QAM) signal. The mapping means has an address port coupled to the second combining means, and an input port for inputting mapping characteristics of the first signal segment and mapping characteristics of the second signal segment. The mapping means maps the first signal segment, when present at the address port, at a power level. When the second signal segment is present at the address port, the mapping means maps the second signal segment at the power level. The mapping means maintains a constant value of the power level for the second signal segment and the first signal segment. The transmitter-subsystem means transmits, at a carrier frequency, the QAM-spread-spectrum signal, having a constant value of the power level for each signal segment, using radio waves, over a communications channel.

Figure 5:
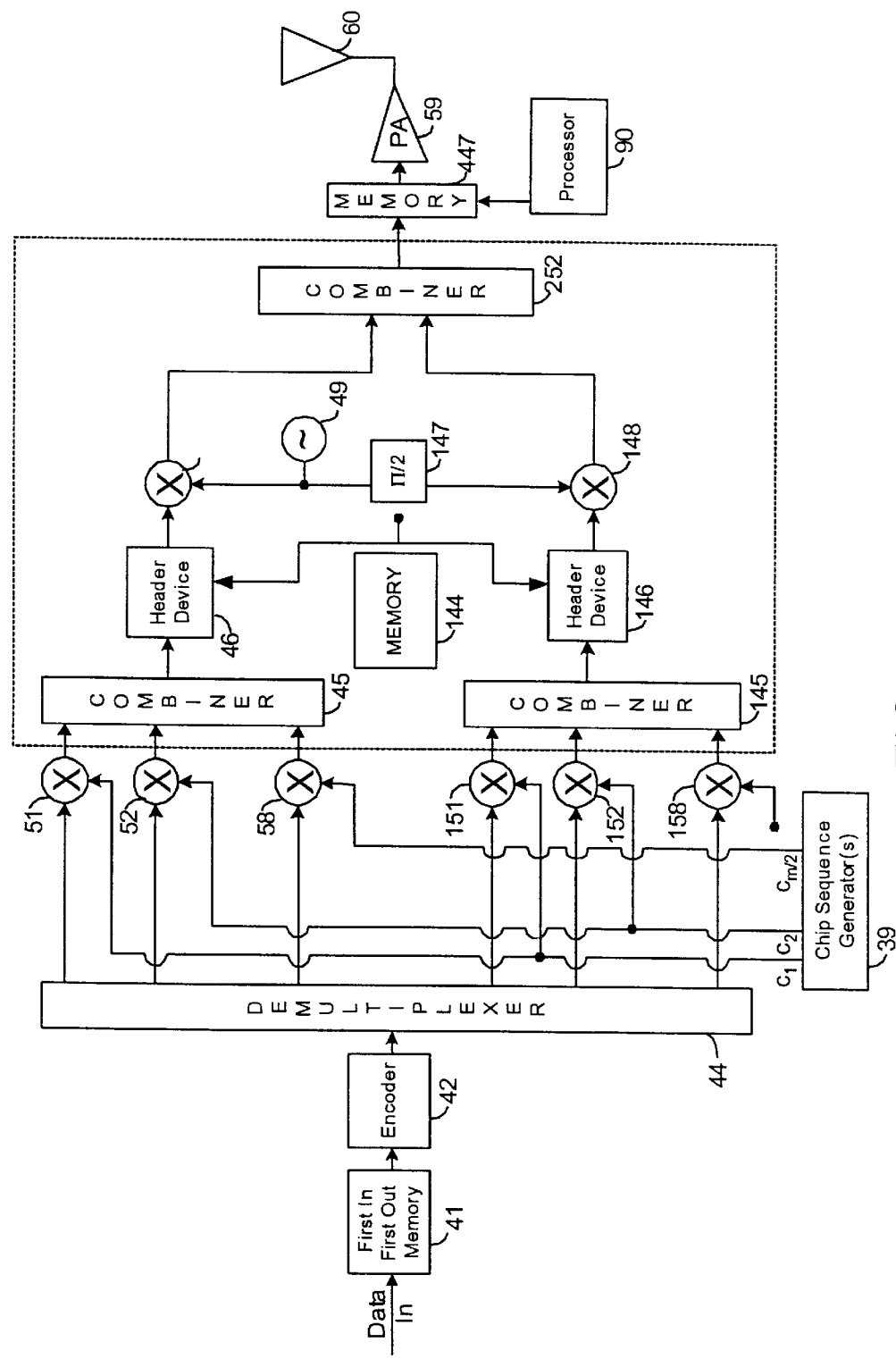

In the exemplary arrangement shown in FIG. 5, the transmitter-memory means is embodied as a transmitter-first-in-first-out (transmitter-FIFO) memory 41. The transmitter-FIFO memory 41 may employ random access memory (RAM) or other memory components as is well known in the art. The transmitter-FIFO memory 41 may be part of a digital signal processor (DSP) or part of an application specific integrated circuit (ASIC).

For the case of an analog signal, an analog-to-digital converter would be inserted before the input to the transmitter-FIFO memory 41 for converting the analog signal to data. The analog-to-digital converter may convert an analog signal to one of a multilevel value, or may be a one bit analog-to-digital converter, i.e., a hard limiter.

The encoder means is embodied as an encoder 42. The encoder 42 may be an encryptor or other privacy device. Encoders and privacy devices are well known in the art for encrypting or scrambling data. If security were not a primary concern, privacy may be achieved employing modulo two addition of a bit-sequence signal, generated from a linear shift register. Encryption sequences, generated from a Data Encryption Standard (DES) algorithm, by way of example, may be used when privacy is of high concern.

The encoder 42 encodes the data from the transmitter-FIFO memory 41, as encoded data. The encoding process may include using any of an encryption device, a privacy device, or other device for uniquely distinguishing, as encoded data, a particular data channel. The term "encoded data," as used herein, broadly means data that are encrypted or scrambled for privacy. Privacy is not the necessary use of the encoded data, however. The encoded data serve to distinguish a first QAM-spread-spectrum signal from a second QAM-spread-spectrum signal.

The demultiplexing means is embodied as a demultiplexer 44. The demultiplexer 44 may be embodied as u serial-to-parallel converter. The outputs of the demultiplexer 44 are divided into a first plurality of outputs and a second plurality of outputs. Each output of the demultiplexer 44 has a demultiplexed portion of the encoded signal.

The transmitter-spread-spectrum means is embodied as a chip-sequence means, a first plurality of product devices 51–58 and a second plurality of product devices 151–158. The chip-sequence means may be embodied as a chip-sequence generator 39 for generating a plurality of chip-sequence signals.

Alternatively, the transmitter-spread-spectrum means may be embodied as a plurality of EXCLUSIVE-OR gates, coupled between the plurality of outputs of the demultiplexer 44, and a memory device for storing the plurality of chip-sequence signals. In this embodiment, the memory device outputs a respective chip-sequence signal in response to the respective sub-data-sequence signal.

A third alternative may include having the transmitter-spread-spectrum means embodied as a memory device, with an appropriate detection circuit, so that in response to a particular data symbol or data bit at the output of a particular output of the demultiplexer, a chip-sequence signal is substituted for that data symbol or data bit. The transmitter-spread-spectrum means may also be embodied as other technology known in the art capable of outputting a plurality or chip-sequence signals.

The first combining means is embodied as a first combiner 45 and a second combiner 145, the header means is embodied as a first header device 46 for concatenating a first header with data and a second header device 146 for concatenating a second header with data, and the transmitter-subsystem means is embodied as a transmitter subsystem. A memory 144 may store the header used by first header device 46 and second header device 146. A memory for storing the header may be included as part of the first header device 46 and the second header device 146. Alternatively, a shift register wish appropriate taps may generate the header, as is well known in the art.

The second combining means is embodied as a third combiner 52. The third combiner 52 is coupled to the first header device 46 and the second header device 146. The third combiner 52 combines the first packet-spread-spectrum signal from the first header device 46 with the second packet-spread-spectrum signal from the second header device 146 as a QAM spread-spectrum signal. When the first header and the second header are identical, then the header portion of the QAM spread-spectrum signal is a BPSK spread-spectrum signal. The data portion of the QAM spread-spectrum signal is quadrature-amplitude modulated.

It is anticipated that the header portion of the QAM spread-spectrum signal will use BPSK modulation, and the data portion of the QAM spread-spectrum signal will use QAM.

The mapping means is embodied as a mapping memory 447. The mapping memory 447 has an address port coupled to the third combiner 52, and an input port, typically coupled to processor 90, for inputting mapping characteristics of the first signal segment and mapping characteristics of the second signal segment. When the first signal segment is present at the address port, the mapping memory 447 maps the first signal segment at a power level. The mapping of the first signal segment may be a pass through the mapping memory 447 of the first signal segment, without alteration to the first signal segment. When the second signal segment is present at the address port, the mapping memory 447 maps the second signal segment at the power level. The mapping of the second signal segment typically alters the second signal segment so that the second signal segment has the same average power as the first signal segment. The mapping maintains a constant value of the power level for the second signal segment and the first signal segment.

The QAM spread-spectrum signal typically is in digital form while in mapping memory 447, and similarly is converted to analog form by digital-to-analog converter 448, as shown in FIG. 4.

The transmitter subsystem may include an oscillator 49 and in-phase multiplier device 48 for shifting a first multichannel-spread-spectrum signal to a carrier frequency, a quadrature phase multiplier device 148 coupled through a 90° phase shift device 147 to the oscillator 49 for shifting a second multichannel-spread-spectrum signal to a carrier frequency, a combiner 52 and a power amplifier 59 and/or other circuitry as is well known in the art for transmitting a signal over a communications channel. The QAM-spread-spectrum signal in analog form is transmitted using an antenna 60. The QAM modulator 67 comprises the elements within the dashed lines.

As shown in FIG. 5, the encoder 42 is coupled between the transmitter-FIFO memory 41 and the demultiplexer 44. The chip-sequence generator 39 is coupled to the first plurality of product devices 51–58, and to the second plurality of product devices 151–158. The firs: combiner 45 is coupled between the first plurality of product devices 51–58 and the first header device 46, and the first header device 46 is coupled to the in-phase multiplier device 48. The second combiner.145 is coupled between the second plurality of product devices 151–158 and the second header device 146, and the second header device 146 is coupled to the quadrature-phase multiplier device 148.

The transmitter-FIFO memory 41 receives data from a data input, and stores the data. The first data stored in the transmitter-FIFO memory 41 are the first data outputted from the transmitter-FIFO memory 41.

The encoder 42 encodes the data from the transmitter-FIFO 41 as encoded data. The encoder 42 encodes the data using privacy type encoding, i.e., scrambling the data or encrypting the data. Thus, the encoded data are scrambled data or encrypted data.

The encoder 42 is necessary for distinguishing data from different users. By having the proper key for decoding the encoded data, data from a particular user are distinguished from data from other users. Thus, the encoding of the data is what defines a user's channel, unlike other multichannel spread-spectrum systems, where a user's channel is defined by a particular chip-sequence signal. By encoding the data with encoder 42, a common set of chip-sequence signals can be used by all users, reducing the cost of having matched filters or correlators. The reduced cost is achieved since, at a receiver, different sets of matched-filters or correlators are not required for each user but instead one set of matched filters or correlators is required for despreading the multichannel-spread-spectrum signal from all users.

The demultiplexer 44 demultiplexes the encoded data into a first plurality of sub-data-sequence signals and a second plurality of sub-data-sequence signals, with a respective sub-data-sequence signal at a respective output of the demultiplexer 44. Typically, the first plurality of sub-data-sequence signals are half of the data-sequence signals outputted from the demultiplexer 44, and the second plurality of sub-data-sequence signals are the other half of the data-sequence signals outputted from the demultiplexer 44.

The chip-sequence generator 39 generates a plurality of chip-sequence signals. Each of the chip-sequence signals of tile plurality of chip-sequence signals has low correlation will he other chip-sequence signals in the plurality of chip-sequence signals, and is preferably orthogonal to the ocher chip-sequence signals in the plurality of chip-sequence signals.

The chip sequences used for data spreading are not necessarily pseudonoise sequences. The chip sequences may be derived from the Barker sequences of length 11; each Barker sequence is a shift of the original Barker sequence of length 11. In order to make the Barker sequence set orthogonal, each shift of the original BARKER code of length 11 is augmented with a 1.

In a preferred embodiment, the chic-sequence generator 39 generates a particular chip-sequence signal from Barker sequences in combination with a pseudorandom cover sequence. Thus, Barker sequences are multiplied by toe same pseudorandom sequence. The use of Barker sequences with pseudorandom sequences gives protection against multipath as well as better cross-correlation properties.

TABLE 5

| | | | | | | | | | | | |
|---|---|---|---|---|---|---|---|---|---|---|---|
| 1 | 1 | 1 | 1 | −1 | −1 | −1 | 1 | −1 | −1 | 1 | −1 |
| 1 | −1 | 1 | 1 | 1 | −1 | −1 | −1 | 1 | −1 | −1 | 1 |
| 1 | 1 | −1 | 1 | 1 | 1 | −1 | −1 | −1 | 1 | −1 | −1 |
| 1 | −1 | 1 | −1 | 1 | 1 | 1 | −1 | −1 | −1 | 1 | −1 |
| 1 | −1 | −1 | 1 | −1 | 1 | 1 | 1 | −1 | −1 | −1 | 1 |
| 1 | 1 | −1 | −1 | 1 | −1 | 1 | 1 | 1 | −1 | −1 | −1 |
| 1 | −1 | 1 | −1 | −1 | 1 | −1 | 1 | 1 | 1 | −1 | −1 |
| 1 | −1 | −1 | 1 | −1 | −1 | 1 | −1 | 1 | 1 | 1 | −1 |
| 1 | −1 | −1 | −1 | 1 | −1 | −1 | 1 | −1 | 1 | 1 | 1 |
| 1 | 1 | −1 | −1 | −1 | 1 | −1 | −1 | 1 | −1 | 1 | 1 |
| 1 | 1 | 1 | −1 | −1 | −1 | 1 | −1 | −1 | 1 | −1 | 1 |

The matrix of Table 5 illustrates the Barker sequence set. Each row is a Barker sequence derived from the row above by a rotation. The rotation affects only the second through the twelfth element. The first element stays the same and is a "1"; this is the augmentation symbol that makes the Barker sequences orthogonal.

The system operates in two modes. The first mode is compatible with the IEEE 802.11 standard and it uses only one sequence: the original Baker code of length 11. In this mode the data rates sustained are 1 and 2 Mbps. In the second mode, the data rates sustained go to a maximum of 20.17 Mbps. In this embodiment, the maximum data rate is 4.83 Mbps. The high data rate is obtained without bandwidth expansion. Both modes use the same clock (chip) rate, which is an advantage in the implementation of the chip.

In FIG. 5, the first plurality of product devices 51–58, and the second plurality of product devices 151–158, for example, may be embodied as a plurality of EXCLUSIVE-OR gates coupled between the plurality of outputs of the demultiplexer 44 and the chip-sequence means. Each EXCLUSIVE-OR gate multiplies a respective sub-data-sequence signal from the demultiplexer,.by a respective chip-sequence signal from the chip-sequence generator 39.

The first plurality of product devices 51–58 multiplies each of the first plurality of sub-data-sequence signals by a respective chip-sequence signal from the chip-sequence generator 39. At the output of the first plurality of product devices 51–58 is a first plurality of spread-spectrum channels, respectively. The second plurality of product devices 151–158 multiplies each of the second plurality of sub-data-sequence signals by a respective chip-sequence signal from the chip-sequence generator 39. At the output of the second plurality of product devices 151–158 is a second plurality of spread-spectrum channels, respectively. A particular spread-spectrum channel is identified by the chip-sequence signal that was used to spread-spectrum process the particular sub-data sequence signal. The plurality of chip-sequence signals used do multiply the first plurality of sub-data-sequence signals may be used to multiply the second plurality of sub-data-sequence signals. Alternatively, a first plurality of chip-sequence signals may be used to multiply the first plurality of sub-data-sequence signal, and a second plurality of chip-sequence signals may be used to multiply the second plurality of sub-data-sequence signals, with the first plurality of chip-sequence signals different from the second plurality of chip sequence signals.

The first combiner 45 algebraically combines the first plurality of spread-spectrum channels, and outputs the combined signal as a first multichannel-spread-spectrum signal. Preferably, the first combiner 45 combines the first plurality of spread-spectrum channels linearly, although some nonlinear process may be involved without significant degradation in system performance.

The second combiner 145 algebraically combines the second plurality of spread-spectrum channels, and outputs the combined signal as a second multichannel-spread-spectrum signal. Preferably, the second combiner 145 combines the first plurality of spread-spectrum channels linearly, although some nonlinear process may be involved without significant degradation in system performance.

The first header device 46 concatenates a first header to the first multichannel-spread-spectrum signal. At the output of the first header device 46 is the first packet-spread-spectrum signal. The first header is for chip-sequence synchronization at the receiver.

The second header device 146 concatenates a second header to the second multichannel-spread-spectrum signal. At the output of the second header device 146 is the second packet-spread-spectrum signal The second header is for chip-sequence synchronization a: the receiver.

The in-phase multiplier device 48 shifts the first packet-spread-spectrum signal to a carrier frequency, as an in-phase component of the carrier frequency. The quadrature-phase multiplier device 148 shifts the second packet-spread-spectrum signal to the carrier frequency, as a quadrature-phase component.

The third combiner 52 combines the first packet-spread-spectrum signal, as the in-phase component, and the second packet-spread-spectrum signal, as the quadrature-phase component, to generate a QAM-spread-spectrum signal. The transmitter transmits, at the carrier frequency, the QAM-spread-spectrum signal using radio waves over a communications channel. The transmitter subsystem of the packet transmitter includes appropriate filters, power amplifiers 59 and matching circuits coupled to an antenna 60. The transmitter subsystem also may include a hard limiter, for hard limiting the packet-spread-spectrum signal before transmitting.

It will be apparent to those skilled in the art that various modifications can be made to the high performance signal structure with multiple modulation formats of the instant invention without departing from the scope or spirit of the invention, and it is intended that the present invention cover modifications and variations of the high performance signal structure with multiple modulation formats provided they come within the scope of the appended claims and their equivalents.

We claim:

1. A packet transmitter or communicating data, comprising:

a demultiplexer, coupled to a data input and having a plurality of outputs, for demultiplexing the data into a plurality of sub-data-sequence signals, with a respective sub-data-sequence signal at a respective output of said demultiplexer;

chip-sequence means for outputting a plurality of chip-sequence signals, with each chip-sequence signal orthogonal to the other chip-sequence signals in said plurality of chip-sequence signals;

a plurality of product devices, coupled to the plurality of outputs of said demultiplexer, respectively, and to said chip-sequence means, for multiplying each of the sub-data-sequence signals by a respective chip-sequence signal, thereby generating a plurality of spread-spectrum channels;

a combiner, coupled to the plurality of product devices, for algebraically combining the plurality of spread-spectrum channels as a multichannel-spread-spectrum signal;

a header device, coupled to said combiner, for concatenating a header for chip-sequence synchronization, to the multichannel-spread-spectrum signal, thereby generating a packet-spread-spectrum signal having a first signal segment and a second signal segment;

a mapping memory, having an address port coupled to said combiner, and an input port for inputting mapping characteristics of the first signal segment of the packet-spread-spectrum signal and mapping characteristics of the second signal segment of the packet-spread-spectrum signal, said mapping memory, responsive to the first signal segment present at the address port, for mapping the first signal segment at a power level, said mapping memory, responsive to the second signal segment present at the address port, for mapping the second signal segment at the power level, thereby maintaining a constant value of the power level for the second signal segment and the first signal segment of the packet-spread-spectrum signal; and a transmitter subsystem, coupled to said mapping memory, for transmitting on a carrier frequency the packet-spread-spectrum signal using radio waves over a communications channel.

2. The packet transmitter as set forth in claim 1, with said chip-sequence means including a chip-sequence generator for generating the plurality of chip-sequence signals.

3. The packet transmitter as set forth in claim 1, with said chip-sequence means including a memory for storing the plurality of chip-sequence signals.

4. A packet transmitter for communicating data, comprising:
   demultiplexer means, coupled to a data input and having a plurality of outputs, for demultiplexing encoded data into a plurality of sub-data-sequence signals, with a respective sub-data-sequence signal at a respective output of said demultiplexer means;
   transmitter-spread-spectrum means, coupled to the plurality of outputs of said demultiplexer means, for spread-spectrum processing each of the sub-data-sequence signals by a respective chip-sequence signal, thereby generating a plurality of spread-spectrum channels, with the respective chip-sequence signal different from each chip-sequence signal in a plurality of chip-sequence signals for spread-spectrum processing the plurality of sub-data sequence signals, respectively, and with the plurality of chip-sequence signals commonly used by the transmitter-spread- spectrum means;
   combiner means, coupled to the transmitter-spread-spectrum means, for algebraically combining the plurality of spread-spectrum channels as a multichannel-spread-spectrum signal;
   header means, coupled to said combiner means, for adding a header for chip-sequence synchronization, to the multichannel-spread-spectrum signal, thereby generating a packet-spread-spectrum signal having a first signal segment and a second signal segment;
   mapping means, having an address port coupled to said header means, and an input port for inputting mapping characteristics of the first signal segment of the packet-spread-spectrum signal and mapping characteristics of the second signal segment of the packet-spread-spectrum signal, said mapping means, responsive to the first signal segment present at the address port, for mapping the first signal segment at a power level, said mapping means, responsive to the second signal segment present at the address port, for mapping the second signal segment at the power level, thereby maintaining a constant value of the power level for the second signal segment and the first signal segment of the packet-spread-spectrum signal; and
   transmitter-subsystem means, coupled to said mapping means, for transmitting at a carrier frequency the packet-spread-spectrum signal using radio waves over a communications channel.

5. The packet transmitter as set forth in claim 4, with said transmitter-spread-spectrum means including:
   generating means for generating the plurality of chip-sequence signals; and
   a plurality of EXCLUSIVE-OR gates coupled between said demultiplexing means, said combiner means and said generating means, for multiplying the plurality of sub-data-sequence signals by the plurality of chip-sequence signals, respectively, thereby generating the plurality of spread-spectrum channels.

6. The packet transmitter as set forth in claim 4, with said transmitter-spread-spectrum means including a memory for storing the plurality of chip-sequence signals.

7. The packet transmitter as set forth in claim 4, further including any of an encryptor and a privacy device.

8. The packet transmitter as set forth in claim 4, with said transmitter-spread-spectrum means including a plurality of product devices for multiplying each of the sub-data-sequence signals by a respective chip-sequence signal of the plurality of chip sequence signals.

9. The packet transmitter as set forth in claim 4, with said transmitter-spread-spectrum means including a plurality of matched filters, with each matched filter having an impulse response matched to a chip-sequence signal of the plurality of chip-sequence signals, respectively.

10. The packet transmitter as set forth in claim 4, with said transmitter-spread-spectrum means including a plurality of surface-acoustic-wave devices, with each surface-acoustic-wave device having an impulse response matched to a chip-sequence signal of the plurality of chip-sequence signals, respectively.

11. A packet transmitter for communicating data, comprising:
   a demultiplexer, coupled to a transmitter-FIFO memory and having a plurality of outputs, for demultiplexing stored data into a first plurality of sub-data-sequence signals and a second plurality of sub-data-sequence signals, with a respective sub-data-sequence signal at a respective output of said demultiplexer;
   chip-sequence means for outputting a plurality of chip-sequence signals, with each chip-sequence signal orthogonal to the other chip-sequence signals in said plurality of chip-sequence signals;
   a first plurality of product devices, coupled to the plurality of outputs of said demultiplexer, respectively, and to said chip-sequence means, for multiplying each of the first plurality of sub-data-sequence signals by a chip-sequence signal of the plurality of chip-sequence signals, respectively, thereby generating a first plurality of spread-spectrum channels;
   a second plurality of product devices, coupled to the plurality of outputs of said demultiplexer, respectively, and to said chip-sequence means, for multiplying each of the second plurality of sub-data-sequence signals, by a chip-sequence signal of the plurality of chip-sequence signals, respectively, thereby generating a second plurality of spread-spectrum channels;
   a first combiner, coupled to the first plurality of product devices, for algebraically combining the first plurality of spread-spectrum channels as a first multichannel-spread-spectrum signal;
   a first header device, coupled to said first combiner, for concatenating a header for chip-sequence synchronization, to the first multichannel-spread-spectrum signal, thereby generating a first packet-spread-spectrum signal;
   a second combiner, coupled to the second plurality of product devices, for algebraically combining the second plurality of spread-spectrum channels as a second multichannel-spread-spectrum signal;
   a second header device, coupled to said second combiner, for concatenating a header for chip-sequence synchronization, to the second multichannel-spread-spectrum signal, thereby generating a second packet-spread-spectrum signal;
   a third combiner, coupled to said first and second header devices, for combining the first and second packet-spread-spectrum signals as a QAM packet-spread-spectrum signal having a first signal segment and a second signal segment;
   a mapping memory, having an address port coupled to said third combiner, and an input port for inputting mapping characteristics of the first signal segment of the QAM packet-spread-spectrum signal and mapping characteristics of the second signal segment of the QAM packet-spread-spectrum signal, said mapping memory, responsive to the first signal segment present at the address port, for mapping the first signal segment at a power level, said mapping memory, responsive to the second signal segment present at the address port, for mapping the second signal segment at the power level, thereby maintaining a constant value of the power level for the second signal segment and the first signal segment of the QAM packet-spread-spectrum signal; and a transmitter subsystem, coupled to said mapping memory, for transmitting the QAM packet-spread-spectrum signal on a carrier frequency using radio waves over a communications channel.

12. The packet transmitter as set forth in claim 11, with said chip-sequence means including a chip-sequence generator for generating the plurality of chip-sequence signals.

13. The packet transmitter as set forth in claim 11, with said chip-sequence means including a memory for storing the plurality of chip-sequence signals.

14. A packet transmitter for communicating data, comprising:

demultiplexer means, coupled to transmitter-memory means and having a plurality of outputs, for demultiplexing stored data into a first plurality of sub-data-sequence signals and a second plurality of sub-data-sequence signals, with a respective sub-data-sequence signal at a respective output of said demultiplexer means;

transmitter-spread-spectrum means, coupled to the plurality of outputs of said demultiplexer means, for spread-spectrum processing each of the first plurality of sub-data-sequence signals and each of the second plurality of sub-data-sequence signals by a chip-sequence signal of a plurality of chip-sequence signals, respectively, thereby generating a first plurality of spread-spectrum channels and a second plurality of spread-spectrum channels, with the respective chip-sequence signal different from each chip-sequence signal in the plurality of chip-sequence signals for spread-spectrum processing the first plurality of sub-data sequence signals, respectively, and with the plurality of chip-sequence signals commonly used by the transmitter-spread-spectrum means;

first combiner means, coupled to said transmitter-spread-spectrum means, for algebraically combining the first plurality of spread-spectrum channels as a first multichannel-spread-spectrum signal and for algebraically combining the second plurality of spread-spectrum channels as a second multichannel-spread-spectrum signal;

header means, coupled to said combiner means, for adding a first header, for chip-sequence synchronization, to the first multichannel-spread-spectrum signal, thereby generating a first packet-spread-spectrum signal, and for adding a second header, for chip-sequence synchronization, to the second multichannel-spread-spectrum signal, thereby generating a second packet-spread-spectrum signal;

second combiner means, coupled to said header means for combining the first packet-spread-spectrum signal and the second packet-spread-spectrum signal as a quadrature amplitude modulated (QAM) packet-spread-spectrum signal having a first signal segment and a second signal segment;

mapping means, having an address port coupled to said second combiner means, and an input port for inputting mapping characteristics of the first signal segment of the QAM packet-spread-spectrum signal and mapping characteristics of the second signal segment of the QAM packet-spread-spectrum signal, said mapping means, responsive to the first signal segment present at the address port, for mapping the first signal segment at a power level, said mapping means, responsive to the second signal segment present at the address port, for mapping the second signal segment at the power level, thereby maintaining a constant value of the power level for the second signal segment and the first signal segment of the QAM packet-spread-spectrum signal; and transmitter-subsystem means, coupled to said mapping means, for transmitting at a carrier frequency the QAM packet-spread-spectrum signal using radio waves over a communications channel.

15. The packet transmitter as set forth in claim 14, with said transmitter-spread-spectrum means including:

generating means for generating the plurality of chip-sequence signals;

a first plurality of EXCLUSIVE-OR gates coupled between.said demultiplexing means, said combiner means and said generating means, for multiplying the first plurality of sub-data-sequence signals by the first plurality of chip-sequence signals, respectively, thereby generating the first plurality of spread-spectrum channels; and a second plurality of EXCLUSIVE-OR gates coupled between said demultiplexing means, said combiner means and said generating means, for multiplying the second plurality of sub-data-sequence signals by the second plurality of chip-sequence signals, respectively, thereby generating the second plurality of spread-spectrum channels.

16. The packet transmitter as set forth in claim 14, with said transmitter-spread-spectrum means including a memory for storing the plurality of chip-sequence signals.

17. The packet transmitter as set forth in claim 14, further including any of an encryptor and a privacy device.

18. The packet transmitter as set forth in claim 14, with said transmitter-spread-spectrum means including a first plurality of product devices for multiplying each of the first plurality of sub-data-sequence signals by a respective chip-sequence signal of the plurality of chip sequence signals, and a second plurality of product devices for multiplying each of the second plurality of sub-data-sequence signals by a respective chip-sequence signal of the plurality of chip-sequence signals.

19. The packet transmitter as set forth in claim 14, with said transmitter-spread-spectrum means including a first plurality of matched filters and a second plurality of matched filters, with each of the first plurality of matched filters and each of the second plurality of matched filters having an impulse response matched to a respective chip-sequence signal of the plurality of chip-sequence signals.

20. The packet transmitter as set forth in claim 14, with said transmitter-spread-spectrum means including a first plurality of surface-acoustic-wave devices and a second plurality of surface-acoustic-wave devices, with each of the first plurality of surface-acoustic-wave devices and each of the second plurality of surface-acoustic-wave devices having an impulse response matched to a chip-sequence signal of the plurality of chip-sequence signals, respectively.

21. A method for communicating data, comprising the steps of:

- demultiplexing the data into a plurality of sub-data-sequence signals;
- spread-spectrum processing each of the sub-data-sequence signals by a respective chip-sequence signal, thereby generating a plurality of spread-spectrum channels;
- combining the plurality of spread-spectrum channels as a multichannel-spread-spectrum signal;
- concatenating a header for chip-sequence synchronization, to the multichannel-spread-spectrum signal, thereby generating a packet-spread-spectrum signal having a first signal segment and a second signal segment;
- mapping the first signal segment at a power level;
- mapping the second signal segment at the power level, thereby maintaining a constant value of the power level for the second signal segment and the first signal segment of the packet-spread-spectrum signal; and
- transmitting on a carrier frequency the packet-spread-spectrum signal using radio waves over a communications channel.

22. A method for communicating data, comprising the steps of:

- demultiplexing stored data into a first plurality of sub-data-sequence signals and a second plurality of sub-data-sequence signals;
- spread-spectrum processing each of the first plurality of sub-data-sequence signals and each of the second plurality of sub-data-sequence signals by a chip-sequence signal of a plurality of chip-sequence signals, respectively, thereby generating a first plurality of spread-spectrum channels and a second plurality of spread-spectrum channels, with a respective chip-sequence signal different from each chip-sequence signal in the plurality of chip-sequence signals for spread-spectrum processing the first plurality of sub-data sequence signals, respectively;
- combining the first plurality of spread-spectrum channels as a first multichannel-spread-spectrum signal;
- combining the second plurality of spread-spectrum channels as a second multichannel-spread-spectrum signal;
- adding a first header, for chip-sequence synchronization, to the first multichannel-spread-spectrum signal, thereby generating a first packet-spread-spectrum signal;
- adding a second header, for chip-sequence synchronization, to the second multichannel-spread-spectrum signal, thereby generating a second packet-spread-spectrum signal;
- combining the first packet-spread-spectrum signal and the second packet-spread-spectrum signal as a quadrature amplitude modulated (QAM) packet-spread-spectrum signal having a first signal segment and a second signal segment;
- mapping the first signal segment at a power level;
- mapping the second signal segment at the power level, thereby maintaining a constant value of the power level for the second signal segment and the first signal segment of the QAM packet-spread-spectrum signal; and
- transmitting at a carrier frequency the QAM packet-spread-spectrum signal using radio waves over a communications channel.

* * * * *